United States Patent
Kim et al.

(10) Patent No.: US 7,981,473 B2
(45) Date of Patent: Jul. 19, 2011

(54) TRANSIENT ENHANCED ATOMIC LAYER DEPOSITION

(75) Inventors: Gi Youl Kim, San Jose, CA (US); Anuranjan Srivastava, Sunnyvale, CA (US); Thomas E. Seidel, Sunnyvale, CA (US); Ana R. Londergan, Santa Clara, CA (US); Sasangan Ramanathan, San Ramon, CA (US)

(73) Assignee: Aixtron, Inc., Sunnyvale, CA (US)

( * ) Notice: Subject to any disclaimer, the term of this patent is extended or adjusted under 35 U.S.C. 154(b) by 567 days.

(21) Appl. No.: 10/791,334

(22) Filed: Mar. 1, 2004

(65) Prior Publication Data

US 2008/0131601 A1   Jun. 5, 2008

Related U.S. Application Data

(60) Provisional application No. 60/465,143, filed on Apr. 23, 2003.

(51) Int. Cl.
  *C23C 16/00* (2006.01)
(52) U.S. Cl. ......... 427/255.28; 427/255.31; 427/255.32; 427/255.7; 427/248.1
(58) Field of Classification Search .............. 427/248.1, 427/250, 255.29, 255.31
See application file for complete search history.

(56) References Cited

U.S. PATENT DOCUMENTS

| | | | |
|---|---|---|---|
| 4,389,973 A | 6/1983 | Suntola et al. | |
| 5,281,274 A | 1/1994 | Yoder | |
| 5,855,675 A | 1/1999 | Doering et al. | |
| 5,879,459 A | 3/1999 | Gadgil et al. | |
| 6,042,652 A | 3/2000 | Hyun et al. | |
| 6,174,377 B1 | 1/2001 | Doering et al. | |
| 6,270,572 B1 | 8/2001 | Kim et al. | |
| 6,306,216 B1 | 10/2001 | Kim et al. | |
| 6,387,185 B2 | 5/2002 | Doering et al. | |
| 6,458,416 B1 * | 10/2002 | Derderian et al. | 427/301 |
| 6,503,330 B1 | 1/2003 | Sneh et al. | |
| 2002/0092423 A1 | 7/2002 | Gillingham et al. | |
| 2002/0160585 A1 * | 10/2002 | Park | 438/507 |
| 2003/0044538 A1 | 3/2003 | Derderian et al. | |
| 2003/0180458 A1 * | 9/2003 | Sneh | 427/248.1 |

(Continued)

FOREIGN PATENT DOCUMENTS

DE   37 12 113 A1   10/1988

(Continued)

OTHER PUBLICATIONS

Matero et al. Effect of water dose on teh atomic layer deposition rate of oxide thin films. This Solid Films 368 (2000) pp. 1-7.*

(Continued)

*Primary Examiner* — David Turocy
(74) *Attorney, Agent, or Firm* — SNR Denton US LLP

(57) ABSTRACT

A process in which a wafer is exposed to a first chemically reactive precursor dose insufficient to result in a maximum saturated ALD deposition rate on the wafer, and then to a second chemically reactive precursor dose, the precursors being distributed in a manner so as to provide substantially uniform film deposition. The second chemically reactive precursor dose may likewise be insufficient to result in a maximum saturated ALD deposition rate on the wafer or, alternatively, sufficient to result in a starved saturating deposition on the wafer. The process may or may not include purges between the precursor exposures, or between one set of exposures and not another.

19 Claims, 12 Drawing Sheets

U.S. PATENT DOCUMENTS

2005/0260348 A1 11/2005 Lee et al.

FOREIGN PATENT DOCUMENTS

EP 1069599 1/2001
EP 1256638 11/2002

OTHER PUBLICATIONS

Search Report, "International Searching Authority", PCT/US2004/006352, (Dec. 8, 2004).
S.M. George "Atomic Layer Deposition: An Overview", Chem. Rev., 110, pp. 111-131 (2010).
R.A. Wind and S.M. George "Quartz Crystal Microbalance Studies of Al2O3 Atomic Layer Deposition Using Trimethylaluminum and Water at 125° C", J. Phys. Chem. A, 114, pp. 1281-1289 (2010).
J.W. Elam et al., "Viscous Flow Reactor with Quartz Crystal Microbalance for Thin Film Growth by Atomic Layer Deposition", Rev. Sci. Instrum., 73, pp. 2981-2987 (2002).
A.W. Ott et al., "Al2O3 Thin Film Growth on Si(100) Using Binary Reaction Sequence Chemistry", Thin Solid Films, 292, pp. 135-144 (1997).
M.D. Groner et al., "Low Temperature Al2O3 Atomic Layer Deposition", Chem. Mater., 16, pp. 639-645 (2004).

* cited by examiner

TRANSIENT ENHANCED ATOMIC LAYER DEPOSITION

RELATED APPLICATION

This application is related to and, hereby claims the priority benefit of U.S. Provisional Patent Application No. 60/465,143, entitled "Transient Enhanced ALD", filed Apr. 23, 2003.

FIELD OF THE INVENTION

The present invention relates to thin film processing and, more particularly, to methods and apparatus for improvement in the film deposition rate of atomic layer deposition-based processes

BACKGROUND

Atomic layer deposition (ALD) can be characterized as a variant of chemical vapor deposition (CVD) wherein a wafer substrate surface is sequentially exposed to reactive chemical precursors and each precursor pulse is separated from a next, subsequent precursor pulse by an inert purge gas period. Many descriptions of ALD processes and procedures (wherein various reactive precursor chemistries and both thermal and plasma assisted ALD approaches are used) exist. See, e.g., T. Suntola, Material Science Reports, v. 4, no. 7, p. 266 et seq. (December 1989); M. Ritala & M. Leskela, "Deposition and Processing of Thin Films" in Handbook of Thin Film Materials, v. 1 ch. 2, (2002); J. W. Klaus et al., "Atomic Layer Deposition of Tungsten Using Sequential Surface Chemistry with a Sacrificial Stripping Reaction", Thin Solid Films, v. 360, pp. 145-153 (2000); S. Imai & M. Matsumura, "Hydrogen atom assisted ALE of silicon," Appl. Surf. Sci., v. 82/83, pp. 322-326 (1994); S. M. George et al., "Atomic layer controlled deposition of $SiO_2$ and $Al_2O_3$ using ABAB . . . binary reactions sequence chemistry", Appl. Surf. Sci., v. 82/83, pp. 460-467 (1994); M. A. Tischler & S. M. Bedair, "Self-limiting mechanism in the atomic layer epitaxy of GaAs", Appl. Phys. Lett., 48(24), p. 1681 (1986). Several commercial applications of ALD technology, such as the deposition of $Al_2O_3$ for advanced DRAM capacitors, have been reported (see M. Gutsche et al., "Capacitance Enhancements techniques for sub 100 nm trench DRAMs, IEDM 2001, p. 411 (2001)); and there are also many descriptions of ALD reactor architectures in the patent literature. See, e.g., U.S. Pat. Nos. 4,389,973; 5,281,274; 5,855,675; 5,879,459; 6,042,652; 6,174,377; 6,387,185; and 6,503,330. In general, both single wafer and batch reactors are used, and plasma capabilities accompany some embodiments.

The ALD process has many advantages over conventional CVD and PVD (physical vapor deposition) methods to produce thin films in that it can provide much higher film quality and incomparably good step coverage. Therefore it is expected that the ALD process will becomes an important technique for use in the fabrication of next-generation semiconductor devices. However, ALD's low wafer throughput has always been an obstacle to its widespread adoption in industry. For example, as the typical cycle times are on the order of 3-6 sec/cycle, typical film growth rates are on the order of 10-20 Å/min (the film deposition rate (FDR) is given by the product of the ALD deposition rate (Å/cycle) and the reciprocal of the cycle time (cycles/unit time)). Thus a 50 Å thick film can be deposited with a throughput of only up to approximately 15 wafers per hour in a single-wafer ALD reactor.

Most attempts to improve the throughput of ALD processes have involved process controls to rapidly switch between exposure and purge with computer controlled electrically driven pneumatic valves providing precursors pulsed with precision of 10 s of milliseconds. Others have tried to improve throughput using shorter precursor pulsing and purge times as well as different process temperatures and pressures. It is also recommended that reactor volumes be "small", to facilitate precursor purging, and employ heated walls, to avoid the undesired retention of precursors, such as water or ammonia, through the ALD cycle (see Ritala & Leskela, supra). However, with respect to the basic ALD process sequence, the alternative pulsing and purging steps have not materially changed, and no substantial throughput improvements using the above methods have been reported.

Attempts to increase the film deposition rate within the context of conventionally practiced ALD are limited by the practice of long purges to achieve desired ALD film performance. To understand why this is so, consider that the heart of the ALD technology is the self-limiting and self-passivating nature of each precursor's reactions on the heated wafer substrate surface. In the ideal case, each self-limiting chemical half-reaction (e.g., for metal and non-metal reactions) progresses towards a saturated deposition thickness per ALD cycle and follows exponential or Langmuir kinetics. An ALD cycle is the sum of the periods of exposure of the wafer substrate to each precursor and the purge period times to remove excess precursors and reaction byproducts after each such exposure. Suntola's seminal patent (U.S. Pat. No. 4,389,973), described the diffusive nature of the pulsed chemical precursors. The broadening of the precursor pulse through gaseous diffusion places a fundamental limit on how short the interval between pulses can be in order to avoid the occurrence of undesirable CVD reactions. When more diffusive conditions are exhibited in the ALD apparatus, longer purge intervals are required to maintain a desired precursor pulse separation during the ALD cycle to achieve near ideal ALD film growth. Furthermore, an initiation process is key to a continuous startup of the overall ALD process. For example, surface preparation can be carried out to achieve saturation of the Si wafer surface with hydroxyl groups: Si—OH.

The self-limiting reactions of the ALD process yield a deposition rate (e.g., as measured in Å/cycle) that is observed to increase as a function of exposure dose (or time for a given precursor flux) until it reaches saturation. Saturation is characterized by the onset of the absence of further increase of the ALD growth rate with further increase of the precursor exposure dose. For some precursors, such as $H_2O$ and $NH_3$, saturation is characterized by the onset of a substantially slower increase of the ALD growth rate with further increase of the precursor exposure dose. This behavior is frequently referred to as "soft saturation". We refer to the ALD deposition rate (in Å/cycle) as a maximum saturated ALD deposition rate when both precursor exposure doses are sufficient to achieve saturation for both precursors.

Conventional ALD operation is typically carried out at the maximum saturated ALD deposition rate. Further, conventional ALD operation allows for and encourages "over-dosing" of both chemical precursors so that exposure time to the precursor dose during each precursor pulse is more than enough in order to ensure saturation of that precursor's half-reaction for all regions of the substrate. This conventional approach has been the practice of record for ALD technology since 1977 and is often cited, for example in review articles by Ritala & Leskela, supra, and Sneh (O, Sneh, et. al., "Equipment for Atomic Layer Deposition and Applications for Semiconductor Processing," Thin Solid Films, v. 402/1-2, pp.

248-261 (2002)). In this overdosed ALD method, gas dynamics and kinetics play a minor role, (see id., indicating that self-limiting growth ensures precursor fluxes do not need to be uniform over the substrate) and saturation is eventually obtained for all points on the substrate.

The current ALD practice of over-dosage is an inherently inefficient process and puts many limitations on the optimal performance of commercial ALD systems. For example, in the overdose approach the chemical precursor dose in some regions of a substrate continue to be applied even though the film has already reached saturation in that location, because saturation has not yet been achieved in other areas. This results in the waste of the excess precursor, adding cost for chemical usage. Additionally, the purge part of the ALD cycle is burdened with removing more than the necessary amount of precursor left in the reactor for global film coverage. The excess, unreacted precursors can then react in areas of the ALD apparatus located downstream from the wafer surface, such as the pumping conduits and the pump, resulting in undesirable deposition on these components, and increasing the need for cleaning. In some cases, this type of undesired deposition outside the reactor chamber can even cause component failure.

Clearly, the more overdosed the precursors are, the more detrimental these effects can be on the ALD apparatus performance. This contributes to extended equipment downtime for maintenance, which is unacceptable in production environment. Furthermore, the additional time used to globally cover the substrate while overdosing the first exposed regions will add to the diffusion broadening of the precursor pulses, further increasing the interval of purges to reach some useful minimal co-existence of concentrations of precursors in the gas phase. This, in turn, leads to increased time to complete each ALD cycle, and thus lowers the film deposition rate and wafer throughput.

SUMMARY OF THE INVENTION

In one embodiment, an ALD process in which a wafer is exposed to a first chemically reactive precursor dose insufficient to result in a maximum saturated ALD deposition rate on the wafer, and then to a second chemically reactive precursor dose, the precursors being distributed in a manner so as to provide substantially uniform film deposition, is provided. The second chemically reactive precursor dose may likewise be insufficient to result in a maximum saturated ALD deposition rate on the wafer or, alternatively, sufficient to result in a starved saturating deposition on the wafer. The ALD process may or may not include purges between the precursor exposures, or between one set of exposures and not another. Further, the wafer may be exposed to the first chemically reactive precursor dose for a time period providing for a substantially maximum film deposition rate. Also, the wafer may be exposed to further chemically reactive precursor doses, at least one of which is not sufficient to result in a saturating deposition on the wafer.

In a particular embodiment, one of the first and second chemically reactive precursor doses comprises water ($H_2O$) and the other comprises Trimethylaluminum (TMA). The wafer may be at a temperature between approximately 150° C. and approximately 450° C. and located in an environment at a pressure between approximately 10 mTorr to approximately 1 Torr, or approximately 50 mTorr to approximately 500 mTorr. One or both of the first and/or second chemically reactive precursor doses may be applied for a time between approximately 0.02 sec to approximately 2 sec or approximately 0.02 sec to approximately 0.5 sec. The first and the second chemically reactive precursor doses may be delivered substantially uniformly over the wafer and the wafer may be repeatedly exposed to the first and second chemically reactive precursor doses so as to form a material film on the wafer.

A further embodiment of the present invention provides atomic layer deposition (ALD) system having a precursor delivery system configured for exposing a wafer to a first chemically reactive precursor dose insufficient to result in a maximum saturated ALD deposition rate on the wafer, and to a second chemically reactive precursor dose. One or both of the first and/or second chemically reactive precursor doses may be applied for a time between approximately 0.02 to approximately 2 seconds and in a manner so as to provide substantially uniform film deposition on said wafer. In one example of such an ALD system, the precursor delivery system includes an axi-symmetric precursor injector and a precursor distribution plate positioned between the precursor injector and a susceptor configured to support the wafer. Such a precursor distribution plate may include a series of annular zones about a center thereof, each of the zones being configured with a greater number of precursor distributors than an immediately preceding zone as viewed from the center of the precursor distribution plate. Preferably though, the diffuser plate may be configured so as to permit chemically reactive precursors passing therethrough to remain randomized in their trajectories towards the wafer when the ALD system is in operation. Alternatively, the precursor delivery system includes a dome-, cone- or horn-shaped chemical distribution apparatus.

Another embodiment of the present invention provides a sequential CVD process in which a wafer is alternatively exposed to a dose of a first chemically reactive precursor and a dose of a second chemically reactive precursor, wherein at least the second chemically reactive precursor exhibits saturating characteristics, and the dose of the first chemically reactive precursor is selected so a film growth rate is substantially at a maximum value. The first and second precursors may be distributed in a manner so as to provide substantially uniform film deposition, and, in some cases, there is no delay between the does of the two alternating precursor exposures.

In a particular embodiment, the wafer is exposed to the dose of the second precursor so as to achieve its saturation on the wafer. One of the first and second chemically reactive precursor doses may be water ($H_2O$) and the other may be TMA. The wafer may be at a temperature between approximately 150° C. and approximately 450° C. and located in an environment at a pressure between approximately 50 mTorr to approximately 500 mTorr. One or both of the first and/or second chemically reactive precursor doses may be applied for a time between approximately 0.02 sec to approximately 1.0 sec, and the wafer may be repeatedly exposed to the first and second chemically reactive precursor doses to form a material film on the wafer.

A still further embodiment of the present invention provides a CVD apparatus, having a precursor delivery system configured to alternately expose a wafer to a dose of a first chemically reactive precursor selected so a film growth rate is substantially at a maximum value and a dose of a second chemically reactive precursor, at least the second chemically reactive precursor exhibiting saturating characteristics, such that one or both of the first and/or second chemically reactive precursor doses is applied for a time between approximately 0.02 sec to approximately 1.0 sec. This device may include a precursor delivery system having an axi-symmetric precursor injector and/or a dome-, cone- or horn-shaped chemical distribution apparatus.

BRIEF DESCRIPTION OF THE DRAWINGS

The present invention is illustrated by way of example, and not limitation, in the figures of the accompanying drawings in which.

DETAILED DESCRIPTION

Figure 1B:
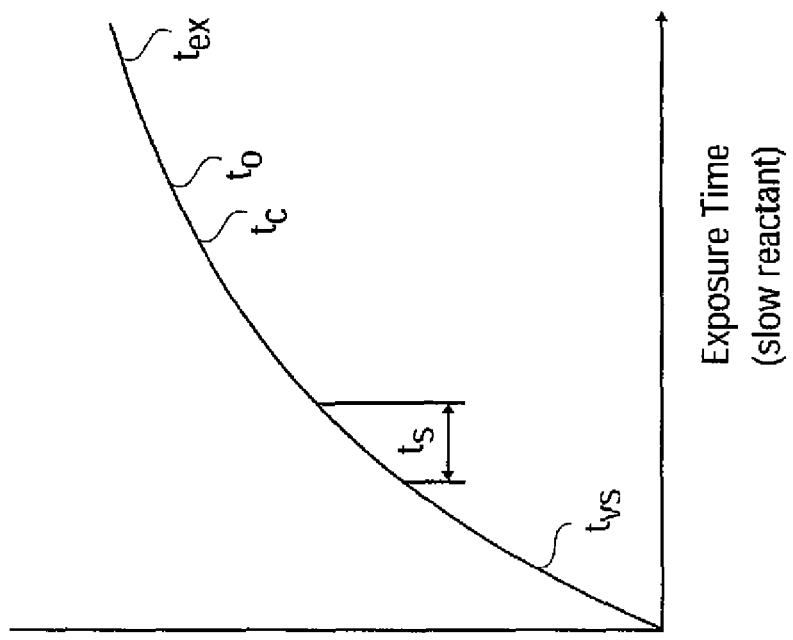
FIGS. 1A and 1B are curves illustrating various ALD deposition rates (Å/cycle) for generically fast and slow reacting chemical precursors, respectively, and certain exposure times are highlighted therefor.

From the above discussion, it should be apparent that methods and apparatus to enhance the throughput of ALD processes are needed. There is further a need for methods and apparatus that allow minimal use of chemical precursor, so as to reduce precursor consumption and preclude the need to purge excess precursor from the reactor. Described herein is an ALD reactor that makes use of both heuristic design concepts and computational fluid dynamics (CFD) analysis to meet these needs, thereby reducing the inefficiencies inherent in conventionally practiced (overdose) ALD.

Stated differently, various embodiments of the present invention provide an innovative ALD process in which substantially simultaneous and distributed precursor exposure to all locations on a featured substrate is practiced. We call this new ALD process "Transient Enhanced Atomic Layer Deposition" or TE-ALD (as compared to conventional ALD processes, which we will refer to below as simply ALD). The present methods and apparatus are designed and applied to achieve minimal use of precursor chemicals, thereby providing increased efficiency due directly to lower chemical exposure. This, in turn, reduces exposure pulse and purge times, decreasing cycle times and increasing throughput.

As more fully described below, an optimization of TE-ALD includes a very high film deposition rate ALD method that uses starved reactions. In some embodiments of this optimized ALD process, which we will refer to as STAR-ALD, the high film deposition rate is further enhanced by the use of purge-free, sequentially reactive ALD-based chemical processes. While conventional ALD "overdose mode" reactors make about 5-20% efficient use of the precursors (i.e., about 5-20% of the metal in the incoming precursor is incorporated into the film), with TE-ALD, the amount of wasted precursor is minimized, and the used precursor may move toward number such as 10-50%.

In various embodiments of the present invention, the use of ALD processes in the starved exposure mode is augmented with considerations of controlled mass transport of the precursors to the substrate surface. In particular, precursor distribution methods including showerheads, distribution plates and cone or horn type funnels are brought to bear so as to provide for precursors to be distributed in a manner so as to achieve substantially uniform film deposition. It should be remembered, however, that the optimized TE-ALD process and the other methods and apparatus described herein are but examples of the present invention and their inclusion in this discussion is not meant to limit the broader spirit and scope of the invention as expressed by the claims following this detailed description. Thus, the processes and systems described herein with reference to the accompanying figures are best regarded as examples, intended to help the reader better understand our invention.

As will become apparent, our TE-ALD apparatus and methods provide the usual ALD benefits of high step coverage, and excellent uniformity and film quality. There are several very useful modes of TE-ALD, including one wherein we optimize the film deposition rate by the use of uniform (or nominally uniform) distribution of precursors and exposure times that are moderately less than that required for the maximum saturation value. We have found that film deposition rates can be improved by a factor of 1.5-2 times over conventional ALD approaches. Another, very important mode is found by using exposure times that are substantially less than those required for maximum saturation. In fact these are best described as starved exposures. It is found that using this approach the film deposition rate can be significantly improved, especially in the absence of a purge, resulting in a 10-20 times increase in deposition rate over conventional ALD approaches. In various embodiments then, the present invention provides ALD methods in which a wafer is first exposed to a first chemically reactive precursor dose insufficient to result in a maximum saturated ALD deposition rate thereon, and then to a second chemically reactive precursor dose, wherein the precursors are distributed across the wafer in a manner so as to provide substantially uniform film deposition.

Figure 1A:
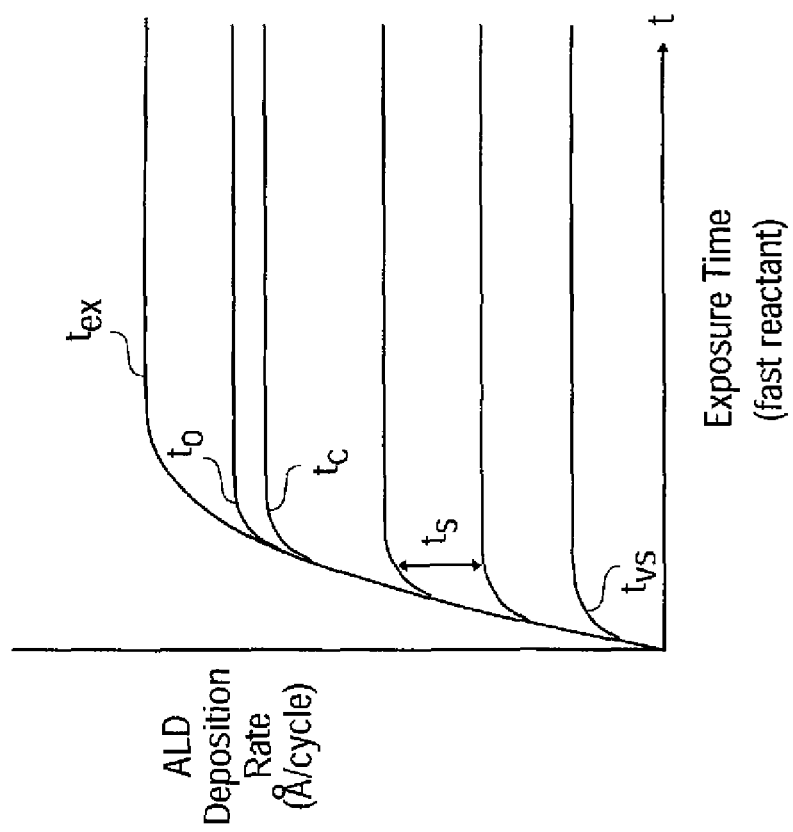

Referring first to FIGS. 1A and 1B, recall that ALD is carried out using self-saturating reactions wherein the ALD deposition rate (in Å/cycle) is observed to increase as a function of exposure dose (or time for a given precursor flux) until it reaches saturation. Saturation is characterized by the onset of the absence of further increase of the ALD growth rate with further increase of the precursor exposure dose. A number of precursors exhibit such behavior, for example trimethalaluminum (TMA), and metal chlorides such as $HfCl_4$, $ZrCl_4$, and $TiCl_4$. In addition, these precursors exhibit fast reactions with high reaction probability. FIG. 1A illustrates a typical ALD deposition rate profile for fast reacting precursors.

However, for some precursors, such as $H_2O$ and $NH_3$, a soft saturation, which can be described as the onset of a substantially slower increase of the ALD growth rate with further increase of the precursor exposure dose, is observed. Often, characteristic of these soft saturation precursors is a relatively slower reaction with lower reaction probability. As a result, uniform film deposition is obtained in both the under-saturated (starved) dose and saturated dose range. Typical saturation characteristics for such slow reacting chemical precursors are illustrated in FIG. 1B.

As mentioned above, we will refer to the ALD deposition rate as being a maximum saturated ALD deposition rate when both precursors exposure doses are sufficient to achieve saturation for both precursors. For the examples shown in FIGS. 1A and 1B, the maximum saturated ALD deposition rate is realized for exposure times exceeding $t_{ex}$. Conventional ALD operation is typically carried out at the maximum saturated ALD deposition rate. In the literature, these values often correspond to within approximately 20% of each other as reported by different research groups carrying out studies on the same precursor chemistries. For example, the maximum saturated ALD deposition rate is about 1.1–1.4 Å/cycle for $TMA/H_2O$ at a temperature around 200° C., and about 0.7–0.9 Å/cycle for temperatures of approximately 300° C.

The present invention takes a marked departure from conventional ALD practice, first by providing conditions for the uniform delivery of the chemical precursors allowing simultaneous (or nominally simultaneous) achievement of uniform coverage on the targeted distributed points and topology of the wafer. Thus, the precursor dose required to obtain uniform coverage over the wafers is minimized. In the curves shown in FIGS. 1A and 1B, this is illustrated as the somewhat lower (than $t_{ex}$) exposure times for both precursors, the values of $t_c$ and $t_o$ defining the range of times and doses suitable to efficiently coat high topology features when the precursors are suitably distributed. Accordingly, operating below the maximum saturated ALD deposition rate results in uniform films with higher film deposition rates, because of the reduced cycle time, which results in higher wafer throughput. When practicing this TE-ALD method, high film quality is maintained with the benefit that film growth rates far exceed conventional ALD.

The curves of FIGS. 1A and 1B further illustrate that in the case when the first precursor reaction is under-saturated (starved) and the second precursor is saturated, the ALD deposition rate is determined by the dose of the first precursor. For example, in our study of transient (kinetic) or starved processes we found in practice that, for TMA and $H_2O$ ALD chemistry, the magnitude or value of the saturating TMA half-reaction depends on the amount of $H_2O$ dosage provided in the limited $H_2O$ exposure region. If we choose an $H_2O$ dose of, for example, half or one-third of the typical value required to obtain the maximum saturated ALD deposition rate (a value labeled $t_s$ in the figure) we find (usefully) that the TMA reaction still saturates (i.e., does not change with its TMA dose), but the magnitude of that ALD deposition rate is significantly lower than the maximum saturated ALD deposition rate for $TMA/H_2O$. We call this saturated level the "starved saturated level."

In the case of optimization of the film deposition rate, FDR (Å/minute), for $TMA/H_2O$, the ALD film growth rate (in Å/cycle) is still sufficiently high as to be very useful. In fact, the FDR can be optimized and goes through a maximum. This is the STAR-ALD process referred to above. For STAR-ALD, uniform film deposition over the wafer surface is observed for $H_2O$ exposures well below the $H_2O$ saturated exposure. If the $H_2O$ pulse time is reduced further to the very starved value, $t_{vs}$, then the ALD deposition rate (Å/cycle) is so small that the film deposition rate (Å/unit time) decreases and trends toward zero.

In accordance with various embodiments of the present invention, minimizing the precursor dose may enable the removal of the purge or purges. That is, by systematically reducing doses to optimize the FDR, the doses in a cycle may be found to be so low that it is possible to substantially reduce one or even both of the purges. This can be applied in the case of the removal of the reactant that is most reactive (e.g., TMA), or the reactant that is least reactive (e.g., $H_2O$) or even in cases where both purges are eliminated (e.g., in the STAR-ALD process).

In a particular embodiment of the present invention, one of the first and second chemically reactive precursor doses comprises $H_2O$ and the other comprises TMA. The wafer may be at a temperature between approximately 150° C. and approximately 450° C. and located in an environment at a pressure between approximately 10 mTorr to approximately 1 Torr (appropriate for TE-ALD), or approximately 50 mTorr to approximately 500 mTorr (appropriate for STAR-ALD). One or both of the first and/or second chemically reactive precursor doses may be applied for a time between approximately 0.02 sec to approximately 2 sec (appropriate to TE-ALD) or approximately 0.02 sec to approximately 0.5 sec (appropriate to STAR-ALD). The first and the second chemically reactive precursor doses may be delivered substantially uniformly over the wafer and the wafer may be repeatedly exposed to the first and second chemically reactive precursor doses so as to form a material film on the wafer.

Figure 2A:
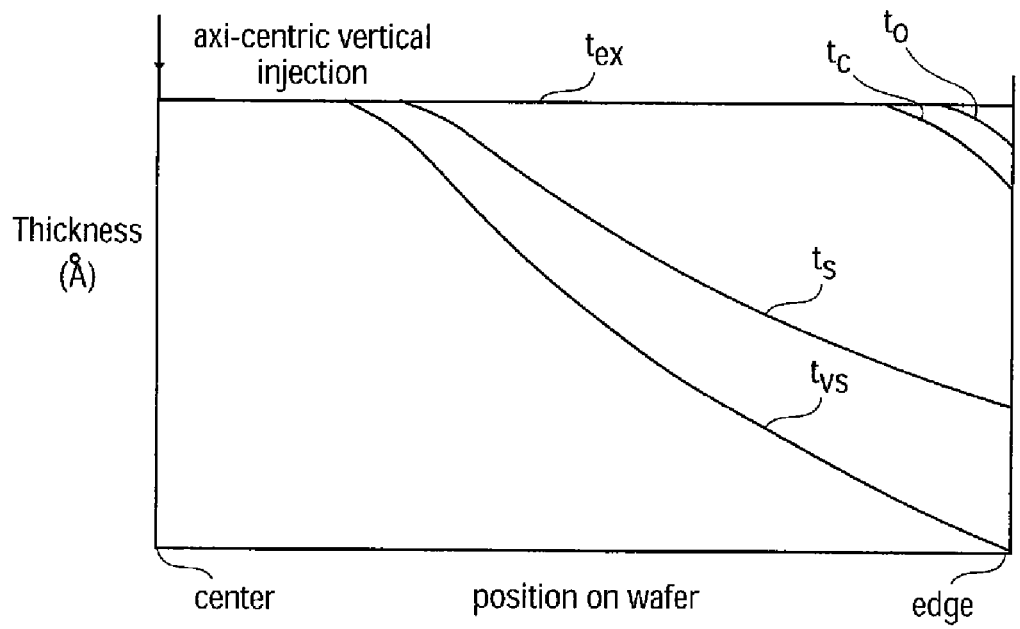
FIGS. 2A and 2B are curves illustrating ALD film thicknesses as a function of position on the wafer for various exposure times, wherein the curve in FIG. 2A corresponds to an axi-centric precursor injection and FIG. 2B corresponds to a well distributed precursor injection.
Figure 2B:
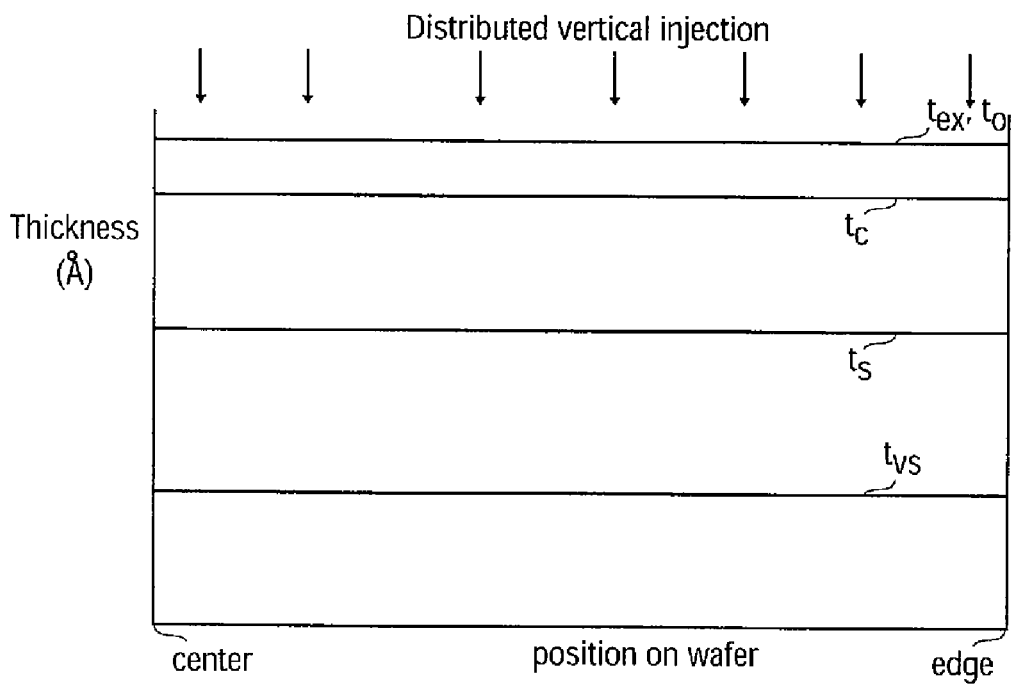

The importance of uniform delivery of the chemical precursors is illustrated in the curves shown in FIGS. 2A and 2B. In FIG. 2A, the film thickness (e.g., for an ALD film, such as $Al_2O_3$) as a function of wafer position is plotted for the case of a single injection precursor port located axi-symmetrically above a distribution plate that is placed between the injection port and the wafer. The thickness of the ALD film is measured along the wafer radius for a "very" starved exposure (e.g., $t_{vs}$ approximately 50 msec) and for several other exposure times. The figure shows that the use of a starved dose of TMA results in a highly non-uniform (and thus not useful) film. This result is predominately determined by the pulse time; while secondary controlling parameters include the reactor pressure and the purge time of the reactive precursor, etc. For example, it is known that higher pressure can lead to higher residence times and deposition rates. Thus, at higher reactor pressure saturation can be achieved on the wafer with a shorter exposure time.

At lower reactor pressures the mass transport of the precursor to the various areas of the wafer may be improved, thus the center-to-edge variation of film thickness for a starved precursor dose may be reduced. This may have advantageous applications for improving uniformity on blanket wafers in the case of STAR-ALD using conventional ALD apparatus. However, even though some applications may only desire uniform deposition on a blanket wafer, the intrinsic ALD deposition rate is adversely lowered with lower pressure.

Furthermore, we seek solutions that provide higher deposition rates and simultaneous uniform penetration into high aspect ratio structures.

FIG. 2B describes the ALD film thickness along the wafer radius achieved using distributed injections of the precursors in accordance with the present invention. Notice that in such situations, the deposition profiles are uniform for various exposure times. Even in the limit of very starved exposure, $t_{vs}$, the film deposition proceeds uniformly. Thus, the precursor dose required to obtain uniform coverage over the wafers is minimized.

For the most challenging of applications, such as capacitor deep trenches, the film coverage proceeds by progression. That is, film deposition takes place first on the planar surfaces, then progressively to the upper regions of high topology features (such as 2- or 3-dimensional trenches), and finally to different depths according to the exposure time or dose. See, e.g., Roy Gordon, et al., "A Kinetic Model for Step Coverage by Atomic Layer Deposition in Narrow Holes or Trenches, Chem. Vap. Deposition", v. 9, no. 2, pp. 73-78 (2003).

Figure 3:
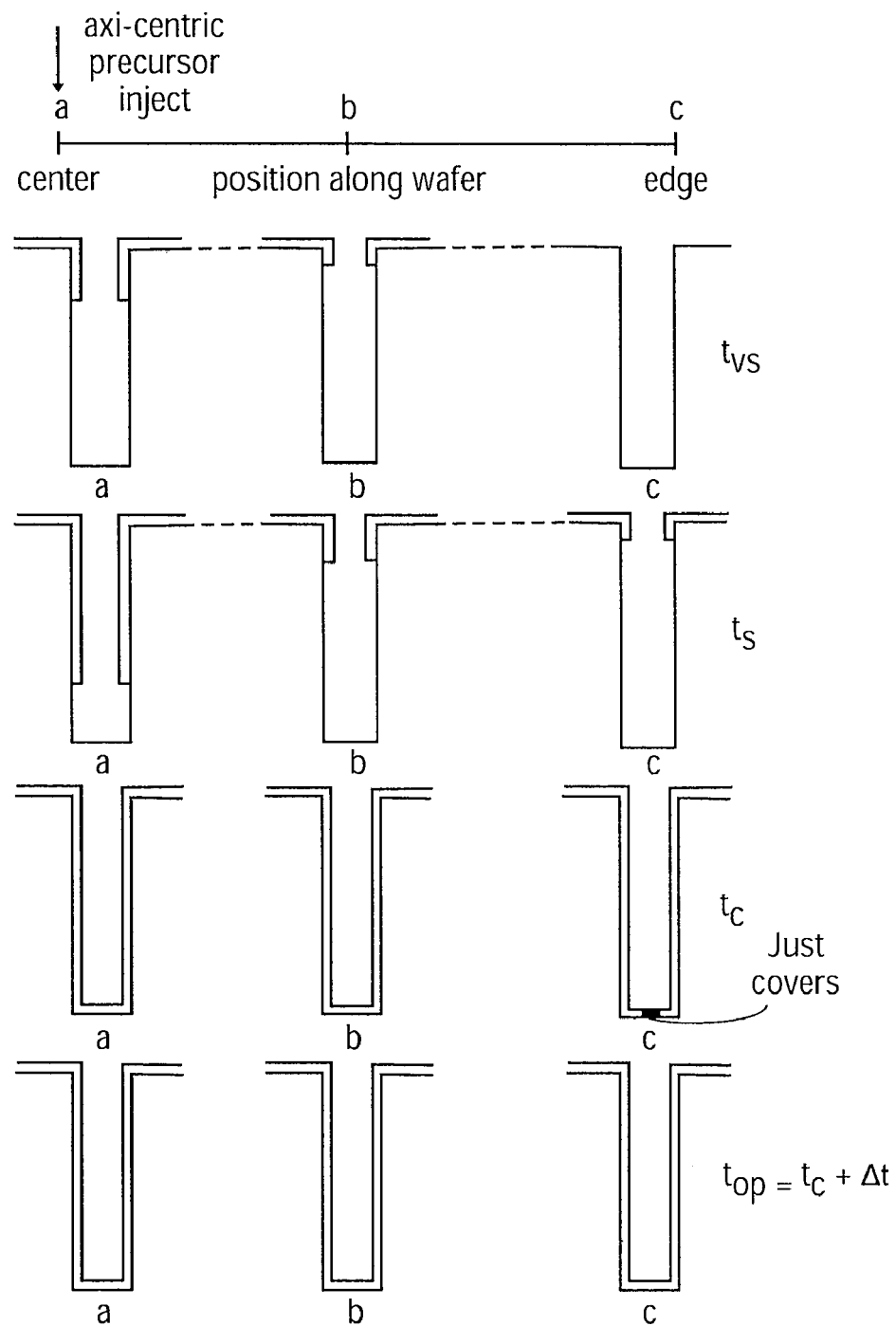
FIG. 3 illustrates various degrees of step coverage of a deep trench topology for various positions on the wafer and times for an axi-centric precursor injection.

FIG. 3 illustrates four stages of this progression of coverage over high aspect ratio structures on a wafer, corresponding to the various timing definitions introduced above, using an axi-symmetric precursor injection apparatus. The first is a "very starved time," $t_{vs}$, and then at an exposure time later where the starvation is neither extreme or absent, $t_s$. Later an exposure time, $t_c$, exists where all the features may be just fully covered. Later still, there is a useful optimum, operational time, $t_{op}$, where (within the design tolerances of the present invention) all features are fully covered with a high probability. We define this as the optimal time ($t_{op}$), just somewhat longer ($\Delta t$) than $t_c$.

The implications of starved reactions for high aspect ratio structures is that the step coverage will be partial on the features of the trenches, and that coverage progresses from top to bottom as the reactants are initially starved near the bottom of the features. The starved behavior is used to define an optimal exposure time progression scheme. As the exposure time is increased, and for the case of axi-symmetric precursor injection, the penetration is deepest where the precursor arrives first (or most densely), similar to the behavior on featureless blanket wafers, as shown in FIG. 2A. As the time is increased to $t_c$, there is just enough precursor everywhere within the high aspect ratio features of the wafer to provide 100% step coverage, therein. When the time is increased to $t_{op}+\Delta t$, the step coverage is achieved everywhere across the wafer with a control tolerance that is within the design of the distribution system.

We have found that even where the ALD monolayer thickness is still not at maximum saturation, full feature conformal coatings can nevertheless be obtained. If the time (and dosage) is made to exceed $t_{op}$ by an amount greater than the tolerance of the technology used to practice TE-ALD, then the time is defined as an excessive time ($t_{ex}$). In practical terms, $t_{ex}$ may be from 1.1 to 1.5 times $t_{op}$. Anything in the range of or larger than $t_{ex}$ is typically what may be practiced in conventional ALD processes. In various embodiments of our TE-ALD process, it was found that useful films (desirable stiochoimetry, electrical quality, conformality, uniformity, etc.) could be formed when the starvation is neither extreme or absent, and it is the case $t_s$ which defines the useful high film deposition rate in STAR-ALD.

Figure 4:
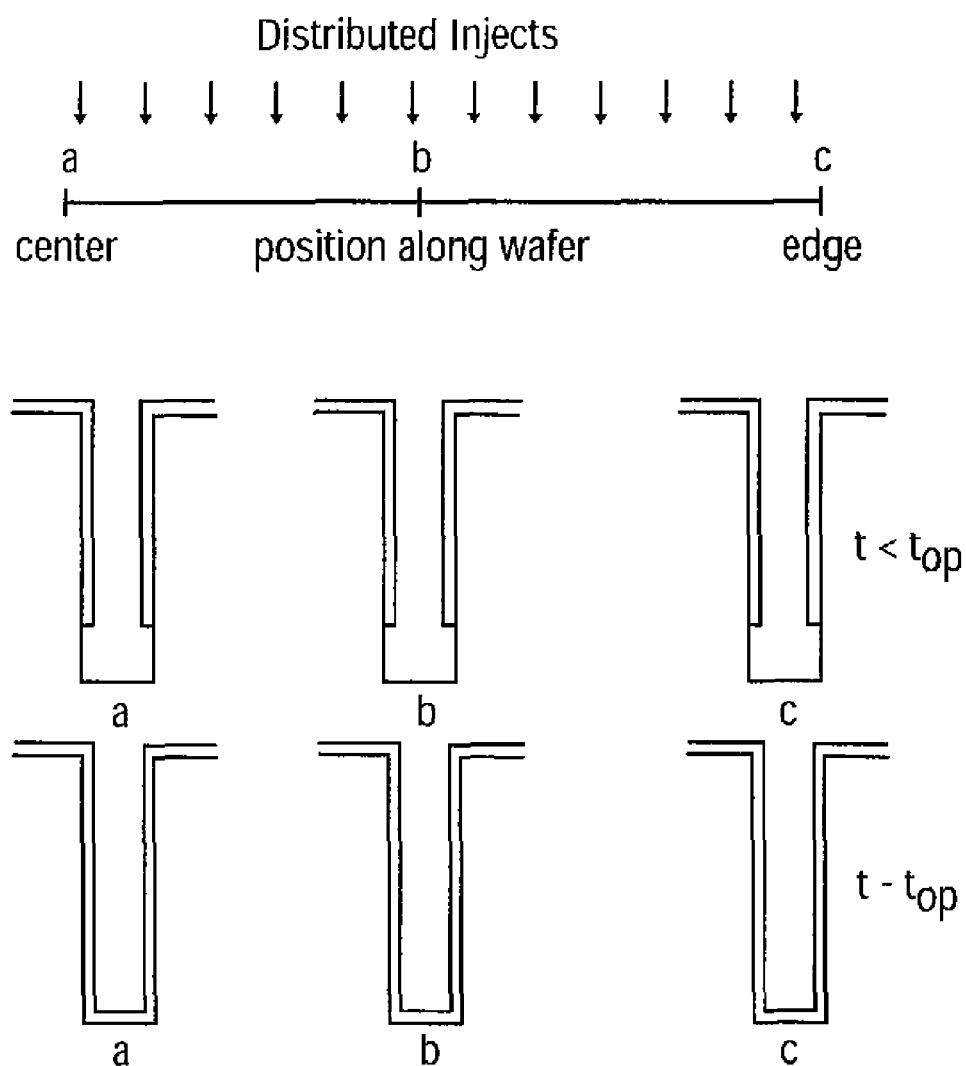
FIG. 4 illustrates various degrees of step coverage of a deep trench topology for various positions on the wafer and times for (i) a distributed precursor injection in the transient regime, and (ii) a well-distributed chemical precursor.

FIG. 4 illustrates the progression of coverage over high aspect ratio structures on a wafer using an ALD apparatus supporting distributed injection of the precursors in accordance with an embodiment of the present invention. When the precursors are distributed uniformly on the wafer, even if the exposure is starved the limited thickness film deposition uniformly penetrates the high aspect ratio topologies. Further, the optimal time, $t_{op}$, for precursor exposure is shorter than was the case described and illustrated in FIG. 3. Consequently, less precursor is required and the throughput enhancements of the present invention are achieved.

As alluded to above, in TE-ALD the precursors are delivered in a spatially distributed fashion substantially simultaneously to all points of interest on a substrate for a specified time interval. This time interval is arranged to be "just above" or "just more than" that necessary to obtain substantially simultaneous coverage of the deepest extent of any high topology structures. This is distinct from the dose or time required to achieve a saturated ALD reaction. In the case of the starved reaction mode, the time interval can be judiciously selected to correspond to an optimum or maximum film deposition rate, and the individual layers can be stopped quite short of saturation.

Figure 5:
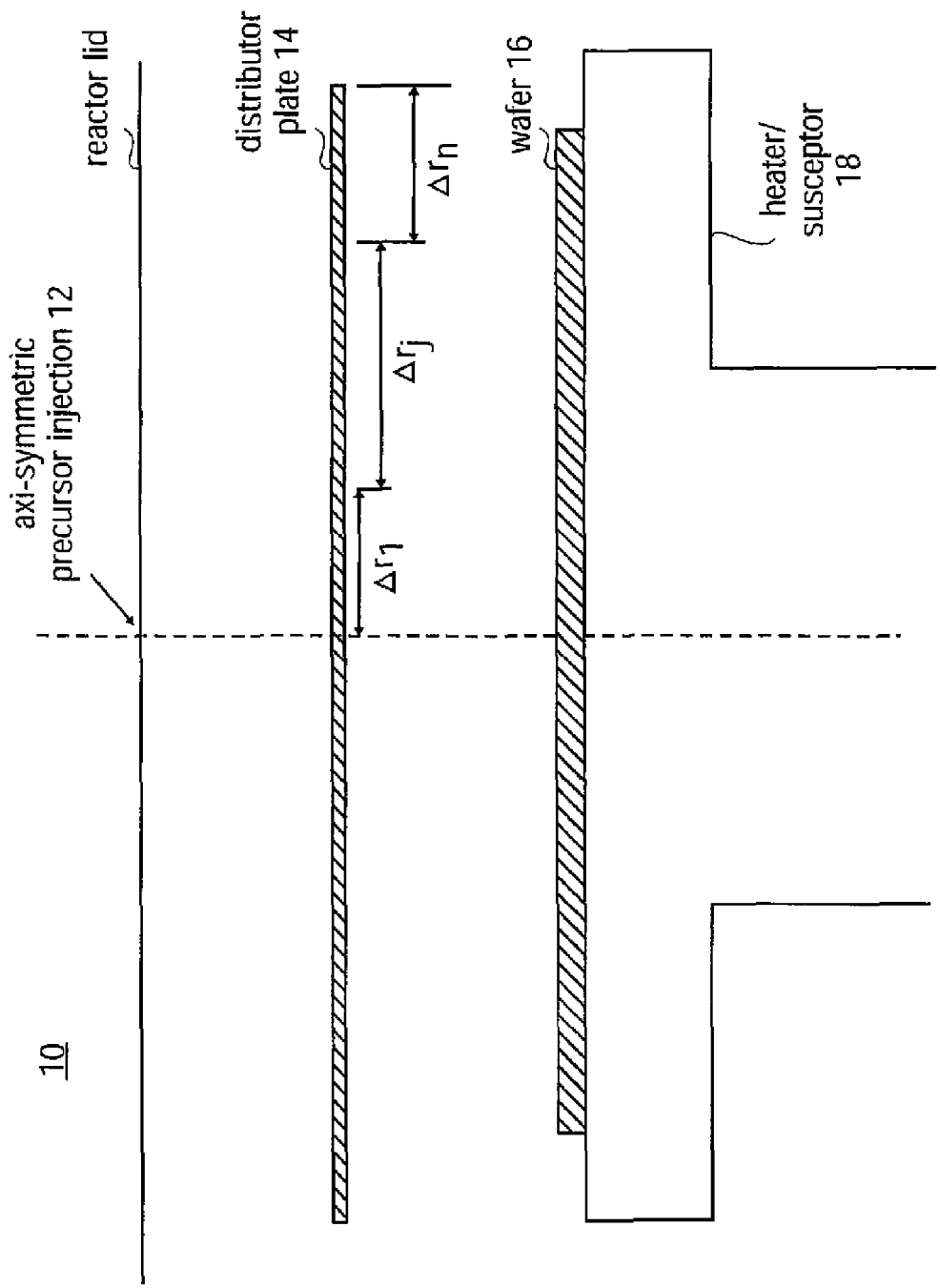
FIG. 5 is a schematic cross-sectional view of an ALD apparatus for distributed precursor injection configured in accordance with an embodiment of the present invention.

FIG. 5 illustrates one embodiment of an ALD system 10 configured for TE-ALD and/or STAR-ALD in accordance with the present invention. This ALD system 10 includes an axi-symmetric port 12, (or one or more centrally located ports) through which precursors and purge gases are injected into the reactor. The reactor pressure is P and the partial pressure of the reactants is Pr. A distribution plate or gas distribution arrangement 14 that guides them to impinge towards the wafer surface in a distributed manner across its diameter is located between the injection port 12 and the substrate 16. The substrate is located on a heated susceptor 18.

The distribution plate (or showerhead) 14 is designed with a regional or zonal layout. The center region ($\Delta r_1$) is mostly closed area (i.e., it has the least amount of open area, or least number of open conduit holes to permit gas to flow through), while annular areas that are progressively further from the center of the wafer (in zone $\Delta r_j$) have progressively greater open areas (e.g., holes). A final annular zone ($\Delta r_N$) reaches to or beyond the edge of the wafer and has the most open area. The progressively more open areas provide more precursor streaming to the outer radii of the substrate, achieving the goal of substantially simultaneous distribution. This form of distribution plate 14 is thus suitable for use in connection with the TE-ALD and STAR-ALD method of the present invention to ensure high aspect ration structures are conformally and efficiently coated.

The use of a distributor (diffuser) plate 14 is not equivalent to the use of a showerhead in conventional ALD apparatus. The goal of distributing the precursors for more uniform placement over the entire wafer may be thought to be achieved by using a conventional or specially designed showerhead device. However, in a conventional showerhead device the precursor pulse is driven through the orifices with a pressure drop that results in vertical streaming (not unlike a water shower, in which the pressure below the shower orifice(s) is lower than the pressure above the orifice(s)). In the present invention, however, the reactor is configured so that the pressure above and below the distributor plate 14 is not significantly different (e.g., the pressures are approximately equal with less than approximately 10% difference therebetween). The distributor plate or gas distribution system 14 may therefore be configured as a showerhead that permits the gas molecules passing therethrough to remain randomized in their trajectories and to be quickly carried through the reaction space. Such a design provides for fast gas transport all the way to the wafer and helps to maintain the integrity of the ALD pulse edges.

Upstream from the axi-symmetric injection port 12, switching valves may be placed in close proximity to (or on) the reactor lid. Such placement will effect the least amount of diffusion broadening. Remote valve switching is less advantageous for fast ALD. Further, although the example of ALD system 10 shown in FIG. 5 has one distributor (diffuser) plate 14, it may be advantageous to have two (or more) such plates in the reaction space, so as to provide the desired coverage results shown in FIG. 4, where t is approximately equal to $t_{op}$.

Figure 6:
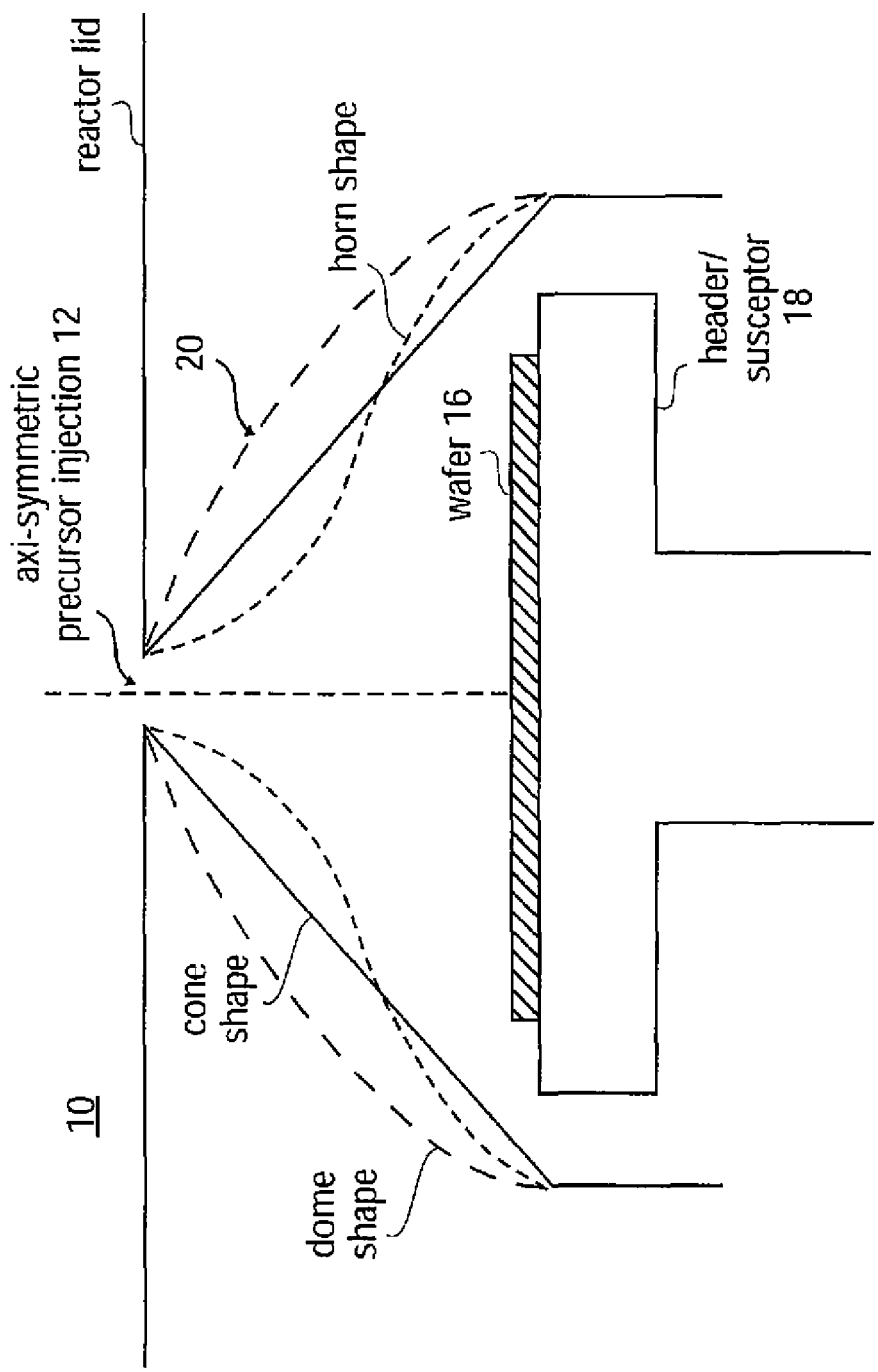
FIG. 6 is a schematic cross-sectional view of an ALD apparatus for distributed precursor injection configured in accordance with alternative embodiments of the present invention.

The distribution plate 14 provides an extra parasitic surface for a precursor in-route to the wafer, providing an additional parasitic deposition surface In FIG. 6, an alternative arrangement that promotes uniform distribution without this parasitic surface is shown, wherein a dome, cone or horn-shaped chemical distribution apparatus 20 is used. Such an apparatus is proposed for the direct transport of precursors from an axi-symmetric port (or one or more centrally located ports). In still further embodiments, a modified showerhead (configured for ease of purging) may be used.

To summarize then, ALD system 10 advantageously provides for substantially simultaneous (in space and time) material deposition to the same depth in high aspect ratio features during the kinetic timeframe of the ALD precursor pulse. By limiting the pulse time to an optimum pulse time, where substantially no excess ALD precursor is used anywhere on the substrate, the process in more efficient than conventional ALD processes. In one embodiment, to achieve a very high conformal and high quality aluminum oxide film, Al-containing and O-containing gases are alternatively pulsed into the chamber. Each half reaction is self-terminated as all areas of the wafer surface are saturated with dosed precursor (although in optimized sub-saturated cases, each half reaction is not saturated to the maximum possible value, and valuable films can be obtained). In-between the alternative pulsing, inert gases are introduced into the chamber to purge residual precursor gases and reaction byproducts. In some cases this process may be performed using precursor pulsing times considerably longer than may be needed to make sure all surface areas of the wafer are fully covered with dosed precursors; that is, the process may be carried out in an overdosed (or over saturated) environment. In such cases, a long enough purge time between the alternating precursor pulses to avoid CVD-like reactions in the chamber are preferable. Hence, one desirable condition for performing these conventional ALD processes using the present ALD system is a long enough purge time. However, where the present ALD system is used in the TE-ALD or STAR-ALD mode (i.e., in conditions of under-saturation or starved exposure) the purge times may be substantially reduced, because less precursor will be present in the reactor chamber.

In describing the STAR-ALD mode above it was noted that the film deposition rate could be maximized by starving the reactions, using limited doses that are well below doses required for the maximum saturated value of the ALD deposition rate. We have found that operation in the starved region provides stoichiometric film quality as well as useful electronic properties. This process for optimization of deposition rate for films deposited in the starved reaction region may be viewed as a special case of our TE-ALD process, as limited doses are still in the transient exposure region and the ALD deposition rate is still significantly increasing with increasing dose.

The STAR-ALD process dramatically improves wafer throughput as it is up to 10-20 times faster than conventional ALD processes. This increase in throughput is achieved through the use of much shorter than usual pulsing times for the precursors and, perhaps more importantly, by removing the time-consuming purge steps.

The concept of throughput optimization for TE-ALD is described by recognizing that in ALD processes, the film deposition rate (in units of Å/unit time) is given by the product of the saturating half reactions for the ALD deposition rate (in units of Å/cycle) multiplied by the value of the quantity: cycle/unit time (which is the reciprocal of the sum of exposure times and the purge times):

$$\text{FDR}(\text{Å/sec}) \sim R_{mx}[1-\exp(-t_m/\tau_m)][1-\exp(-t_{nm}/\tau_{nm})]/(t_m+t_{nm}+t_{purges}) \quad (1),$$

where $t_m$ is the exposure time (in sec) of the metal precursor and $t_{nm}$ is the exposure time (in sec) of the non-metal precursor. $R_{mx}$ is the maximum saturated deposition rate (Å/cycle) for the compound to be formed. $\tau_m$ is the time constant for saturation for the half-reaction for the metal and $\tau_{nm}$ is the time constant of the non-metal. Both are used to approximate the actual ALD saturation behavior using an exponential or Langmuir form. The quantities: $t_m$, $t_{nm}$ and $t_{purges}$ are in units of seconds.

It is noted that the product of the increasing exponentials and decreasing (1/t) functions will have a maximum. At high values of exposure times, the FDR is decreasing like 1/t, and at very small exposure times, the FDR has to go to zero linearly with time, which can be seen using a series expansion of the exponential terms. At some intermediate point, where the 1/t function and the rising exponential functions cross, there will be a maximum in the FDR.

By way of example, consider the case of ALD of $Al_2O_3$ using $TMA/H_2O$. TMA half-reactions are very fast (e.g., typically less than 100 msec) and the water reactions are much slower. As a result, we can approximate the expression of Eq. (1) by assigning the TMA function to be unity and the non-metal (oxidant) saturating reaction to the $H_2O$ precursor. For the case where the purge times are zero or near zero (i.e., substantially less than the exposure time of interest), the expression for the film deposition rate simplifies to:

$$\text{FDR}(\text{Å/sec}) \sim R_{mx}[1-\exp(-t_{nm}/\tau_{nm})]/(t_m+t_{nm}). \quad (2)$$

Figure 7:
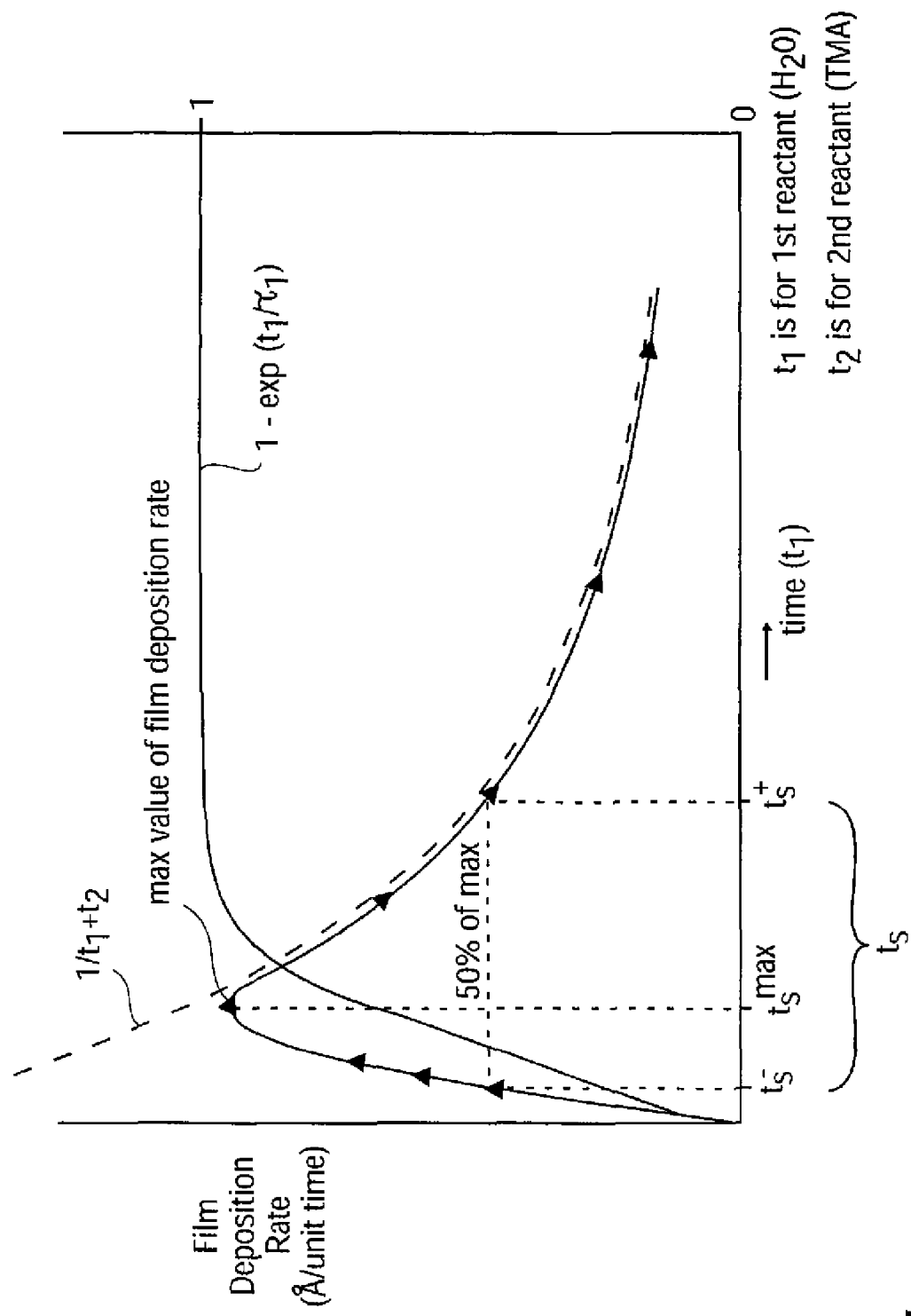
FIG. 7 is a curve illustrating film deposition rate (FDR) as a function of exposure time of the reacting precursors.

This phenomenological description was used as a guide for our work. Calculations of the FDR were carried out for different values of $t_m$ and the results plotted, as shown in FIG. 7 (which is a curve illustrating film deposition rate as a function of exposure time of the reacting precursors). $R_{mx}$ and $t_{nm}$ define the maximum value of the FDR, and $\tau_0$ (which is the effective time constant for saturating of the oxidizing half reaction) approximately controls the time at which the FDR is a maximum value. In our description, $t_m$ is the time for the TMA exposure of the second reactant ($t_2$), and $t_{nm}$ is the time for the $H_2O$ exposure of the first reactant ($t_1$).

In FIG. 7, the FDR is plotted as a solid curve with calculated points (solid triangles) as a function of the exposure time $t_1$. Reading the graph from right to left (i.e., in terms of decreasing exposure time), it is seen that the FDR follows the cycle time function at long times ($1/t_1$), goes through a maximum at $t_s^{mx}$, and then decreases rapidly, trending to zero in the limit of exposure time, $t_1$, approaching zero. A useful exposure range is labeled around $t_s^{mx}$, between $ts^-$ and $ts^+$.

The exponential function $[1-\exp(-t_1/\tau_1)]$ for a slower half-reaction is also plotted in FIG. 7 and is an increasing function with time, while the cycle time function $1/(t_1+t_2)$ is a decreasing function with time. These two crossing functions are responsible for the maximum in the FDR. The calculation shown in FIG. 7 used a $t_2$ value of 0.05 sec, but the quantities in the illustrative graph are plotted in arbitrary units.

The maximum value of the FDR is on the order of 10-20 times higher than FDRs obtained for cycle times on the order of several seconds (see, e.g., the report of experimental data below). There is a useful range of FDR values that can be as low as a factor of 2 below the peak of the curve shown in FIG. 7, thus providing a range of useful starved exposure times, ranging from $t_s^-$ through $t_s^{mx}$ to $t_s^+$. The $t_s^-$ value is associated with a FDR value that is half of the maximum FDR value at a time less than $t_s^{mx}$, and the $t_s^+$ value is associated with a FDR value that is half of the maximum FDR value at a time greater than $t_s^{mx}$. Thus a STAR-ALD process without purges having a wafer exposed to a first chemically reactive precursor dose for a time period providing for a substantially maximum deposition rate is illustrated.

Figures 8A, 8B:
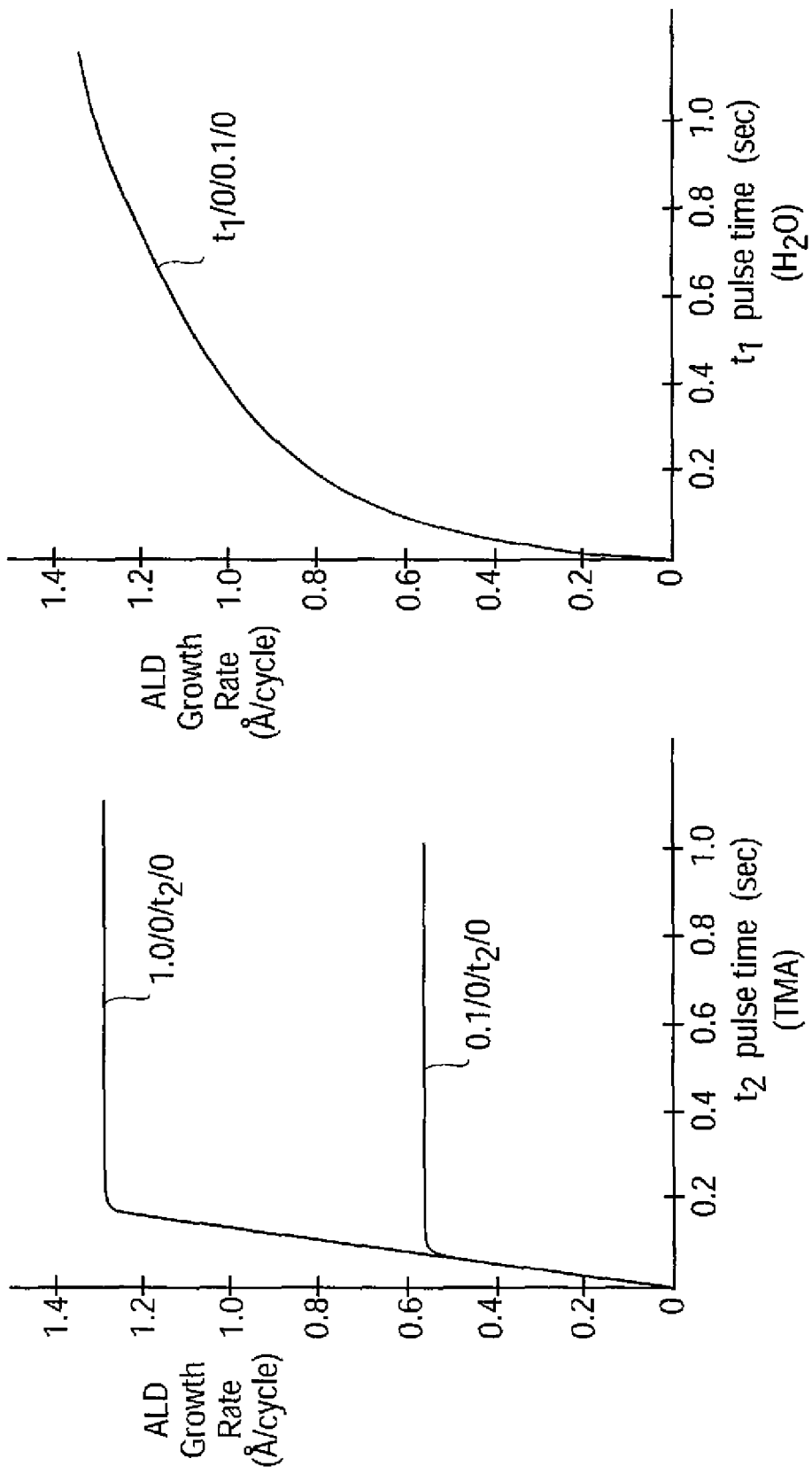
FIGS. 8A and 8B are curves illustrating ALD deposition rates for TMA and $H_2O$, respectively, achieved using methods and apparatus configured in accordance with an embodiment of the present invention.

The feasibility of ALD-like process using the STAR-ALD mode, without purge steps between the alternative precursor pulsing, was characterized. FIGS. 8A and 8B show the effects of varying TMA and $H_2O$ pulsing times on ALD deposition rate (Å/cycle). In these graphs, the exposure conditions use the convention: expose 1 time/purge 1 time/expose 2 time/purge 2 time. The ALD growth rate is plotted as a function of the exposure time $t_2$ of the TMA (FIG. 8A), and $t_1$ of the $H_2O$ (FIG. 8B). The ALD deposition rate (Å/cycle) of aluminum oxide films gradually increases and saturates with increasing $H_2O$ pulsing time. On the other hand, TMA pulsing times, above a certain relatively short time, exhibit "starved saturation" at a value set essentially by the $H_2O$ exposure time. The inserts for the curve with the maximum saturation value is obtained with 1 second exposure of $H_2O$ and zero purge times, and is noted by the convention label: $1.0/0/t_2/0$. The insert for the curve with a reduced saturation value is obtained with 0.1 sec of $H_2O$ exposure and is noted with the convention label: $0.1/0/t_2/0$. The lower curve saturation characteristic is quite similar to a conventional ALD process performed with TMA and $H_2O$ for long time exposures for t, except that the magnitude of the saturated value for a short $H_2O$ exposure is reduced to approximately 0.55 Å/cycle, a little less than half the maximum saturated value obtained for long $H_2O$ exposure (such as 1 sec). The evaluation of these kinds of data were carried out at different temperatures, and the results are substantially similar, but the starved ALD saturated deposition rates increase from 180° C. to about 350° C.

Figure 9:
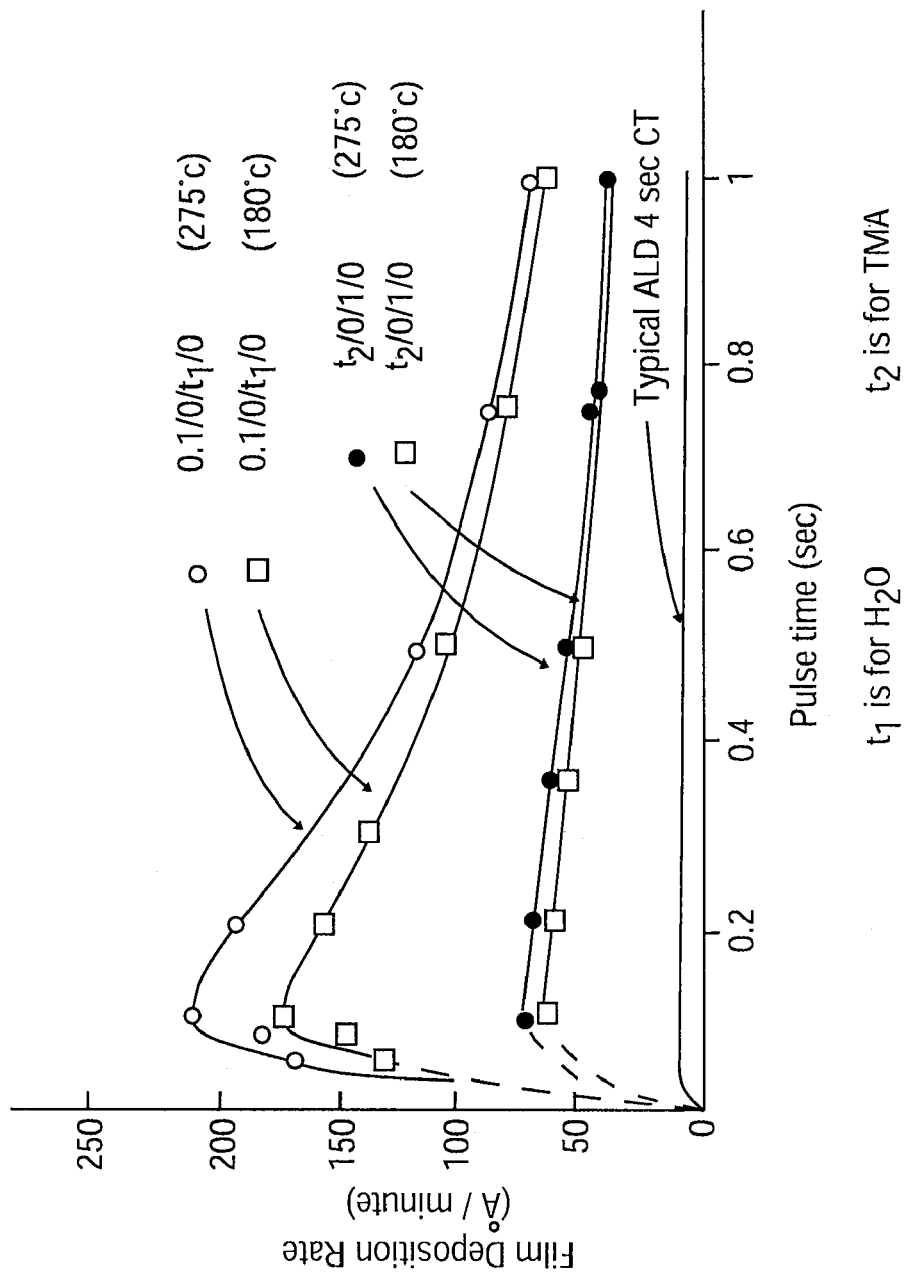
FIG. 9 is a curve illustrating film deposition rates achieved in accordance with embodiments of the present invention for various pulse times of $H_2O$ and TMA at varying temperatures and conditions.

FIG. 9 is a graph in which the film deposition rate is plotted against the exposure time for several exposure conditions and two temperatures (180° C. and 275° C.). The FDR exhibits high deposition rate and a maximum in the starved exposure condition. The upper curves are for the condition 0.1 sec TMA exposure and zero purges, and noted by the convention label: $0.1/0/t_1/0$, where $t_1$ refers to the $H_2O$ exposure time. The lower curves are for the FDR as a function of TMA exposure and zero purges, having 1.0 sec of $H_2O$ exposure and is labeled $t_2/0/1.0/0$. The film growth rate by STAR-ALD was in the range 160 to 220 Å/min and up to approximately 20 times that of typical ALD (typically approximately 10 Å/min). This typical film growth rate by conventional ALD is shown in the bottom of the graph for comparison, using a 4 sec cycle time. The maximum in film deposition rate is consistent with the phenomenological model presented above. Thus it is seen that the STAR-ALD process provides incomparably higher throughput as compared with conventional ALD while maintaining many of the merits thereof. STAR-ALD can therefore be used for applications that demand high wafer throughput and high-thickness film depositions, in addition to applications for which conventional ALD is appropriate.

Figure 10:
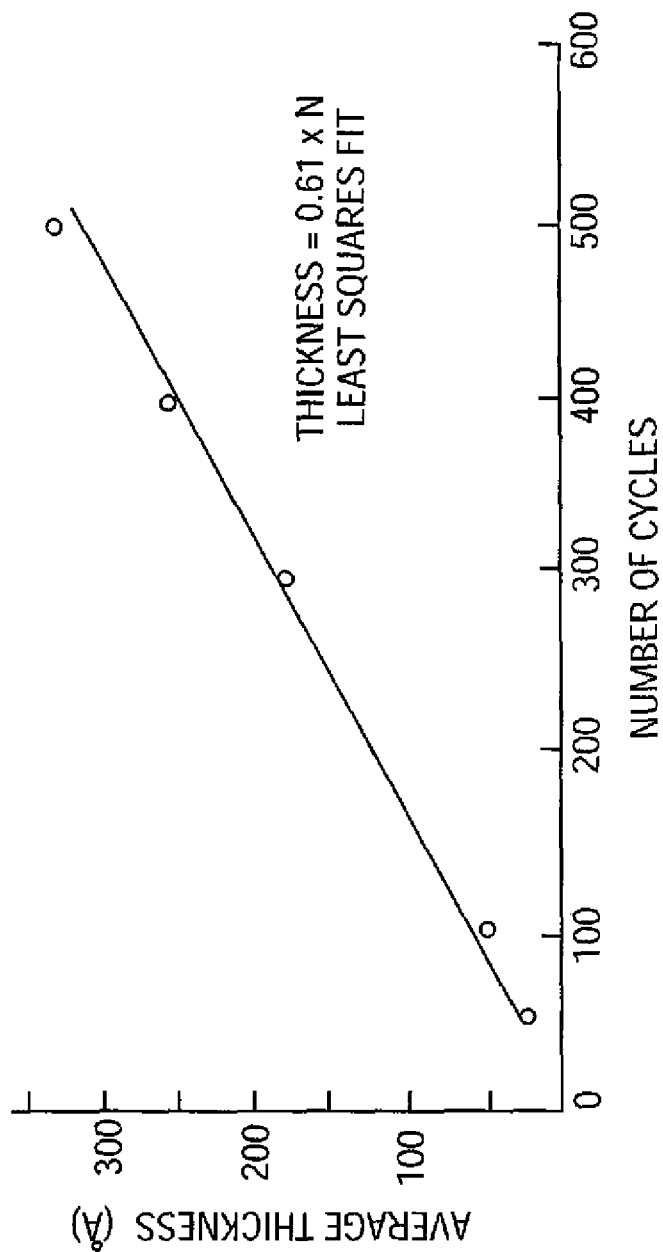
FIG. 10 is a curve illustrating the average thickness of a film produced using a STAR-ALD process in accordance with an embodiment of the present invention as a function of the number of exposure cycles.

In the course of applications of ALD, it is often desirable to use digital thickness control where film thickness is set just by the number of cycles run. It is therefore useful to demonstrate that a STAR-ALD process may also be digitally controlled according to the number of exposure cycles. FIG. 10 is a curve showing a linear relationship between film thickness and the number of STAR-ALD cycles run, according to data that we obtained. This confirms the availability of digital film thickness control. All of the data points in the figure were generated using 0.1 sec of TMA and $H_2O$ pulsing times at 225° C. The time of pulsing was chosen intentionally in the starved region where the growth rate is highly dependent upon precursor pulsing time as shown in FIGS. 8A and 8B. This linear relationship (a least squares fit) is also typically observed in conventional ALD processes, but in those processes precursor pulsing times near $t_{ex}$, provide a maximum saturated ALD deposition rate as discussed above, yet not providing a high film deposition rate (FDR).

Figure 11:
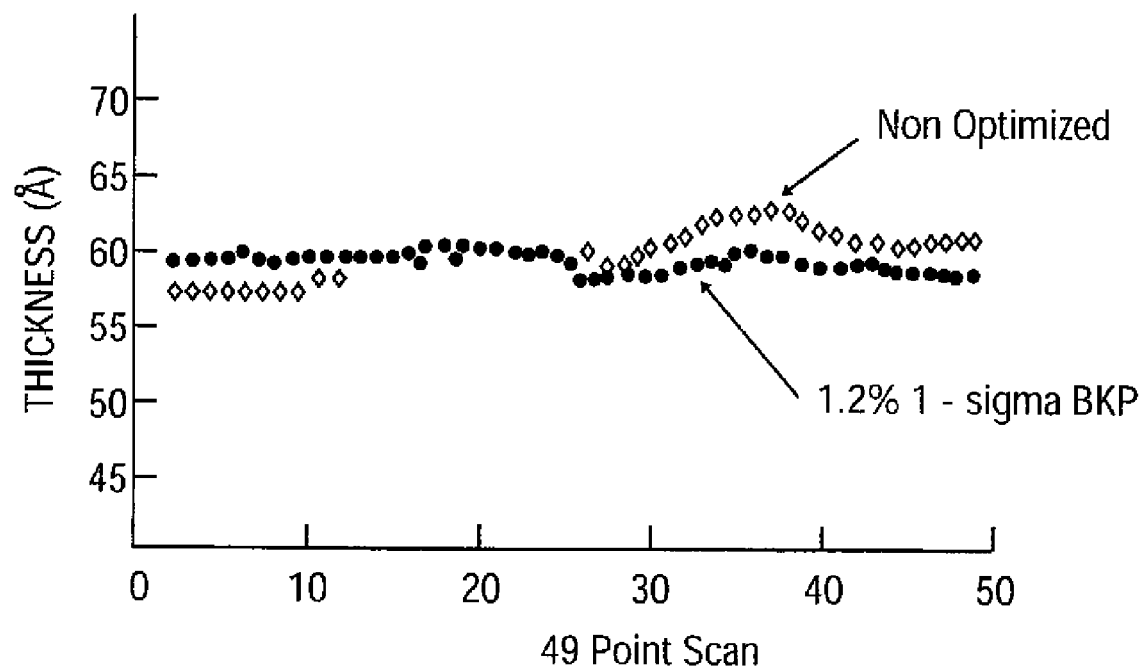
FIG. 11 is a plot illustrating variations in film thickness obtained over 49 points on a wafer surface using a design-of-experiments in which the relative ratios of precursor exposure times and reactor pressures were varied, but without optimizing the manner of injection of the precursors.

Other process parameters determining film uniformity were also studied, and the results of these studies are plotted in the graph depicted in FIG. 11. The curve illustrates a 1.2% (1 sigma) variance in film thickness, which was obtained using a design-of-experiments in which the relative ratios of exposure times of the two precursors and reactor pressures were varied but without optimizing the manner of precursor distribution by reactor design. This is what is expected in the case that the limited exposure saturation is operative and the (starved) saturation is at the heart of the mechanism to provide for good uniformity.

Increasing wafer temperature positively acted on both the growth rate and uniformity in the range 150° C.-350° C. The higher film growth rate may be caused by enhanced reactivity of $H_2O$ driven by higher thermal energy.

In the case of using limited exposure and no purge the STAR-ALD process may have some portion of CVD-like reactions. It is anticipated that the decay of TMA in the reaction space above the wafer is more rapid than the decay of the $H_2O$. Accordingly, we examined the extreme case of simultaneous exposures of the reactants in the same chamber ("Pulsed CVD") and under the same operating conditions as STAR-ALD. The wafer temperature, canister temperature for both TMA and $H_2O$, and total reactor pressure and the number of cycles (150) were set exactly the same. The STAR-ALD run was done using 0.1/0/0.1/0. This comparison was made to see if pulsed CVD deposition and uniformity were fundamentally different, and they were.

Figure 12:
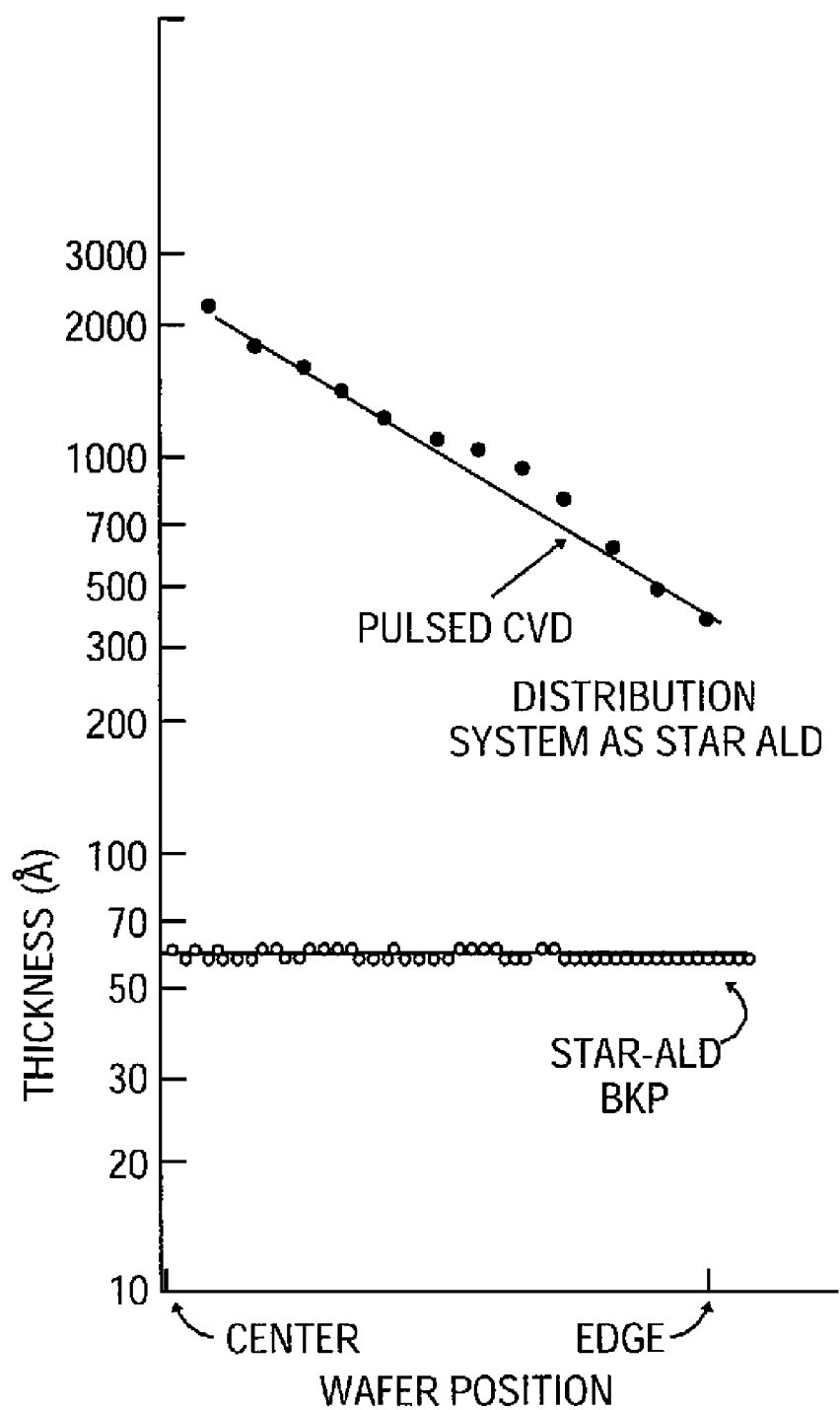
FIG. 12 is a curve illustrating the thickness of a film produced using a STAR-ALD process in accordance with an embodiment of the present invention compared with pulsed CVD, wherein the precursors were injected into the reactor simultaneously.

The results are shown in FIG. 12, which illustrates the thickness of a film produced using a STAR-ALD process in accordance with an embodiment of the present invention compared with that achieved using a pulsed CVD process in which the precursors were injected into the reactor together. The reactor and exposure times were substantially the same for each case. In the case of the pulsed CVD process, the film thickness profile showed very thick values in the center of the wafer (approximately 2180 Å) and very thin values towards the edge (approximately 340 Å) after a 30 sec exposure. The average film growth rate was about 2340 Å/min, much larger than even the largest STAR-ALD value, and the film uniformity was characteristic of an axi-centric non-uniform injection for a CVD process. In contrast, the STAR-ALD run produced a film having substantially uniform thickness (approximately 60 Å) from wafer center to edge. From these results, it should be clear that the STAR-ALD is fundamentally different from pulsed CVD processes, and much more closely resembles ALD processes.

In order to more fully appreciate the significance of STAR-ALD, consider the fact that the use of minimal precursor implies the following:

- The starved half-reactions although not at maximum saturation are apparently fully suitable to build useful films ($Al_2O_3$ is obtained, although the $H_2O$ saturation is not complete).
- Although the ALD deposition rate is less than the maximum possible, a film deposition rate far in excess of standard ALD is obtained. For example, while the ALD deposition rate for long exposures of each precursor and long purges (to avoid parasitic CVD) is approximately 10-20 Å/min, film deposition rates for STAR-ALD is approximately 10 times these values.
- The uniformity was relatively easy to achieve even though a sophisticated gas distribution system was not used, implying that the starved saturation (i.e., the non-maximum value of saturation) for the metal half-reaction can be made uniform over the wafer by optimizing pressure and flow parameters.
- The fact that the precursors are starved implies that excess precursor is very limited and parasitic CVD is reduced and suppressed. The use of zero purge times in the studies reported above supports this. Simply put, if the precursors are under-dosed, there is little excess precursor to participate in parasitic CVD reactions, so a lower and even zero purge time process is possible.

In the TE-ALD and STAR-ALD processes reported above, two precursors were used sequentially. In these methods, the first precursor may be a non-metal bearing precursor (containing an oxidant or a nitridant) and the second precursor may be a metal bearing precursor. In developing applications, however, it is often important to deposit three and even four element films (such as HfAlON or HfSiON). In such cases TE-ALD and STAR-ALD processes can be used with three or more different sequential precursors. It is important, however, that the chemistry chosen be compatible with the formation of useful film material. This may (or may not) be stoichiometric material and thermodynamically stable, as formed, depending on the application. Yet, the films formed in the STAR-ALD studies using $TMA/H_2O$ are characterized and are nominally stiochiometric (as shown by RBS data), with good as deposited breakdown fields (~8 MV/cm). Post deposition anneals may be used to improve or modify the films, with oxidizing or reducing ambients as is known in the art. Such an anneal may improve electrical properties such as breakdown voltages, leakage, etc. It has been found that thinner films made by the STAR-ALD process may have their quality improved by annealing.

Step coverage tests have been carried out using high aspect ratio testers, and nominally 100% step coverage is confirmed for 10:1 AR testers with 100 nm features. This is to be expected due to the starved saturating behavior. Optimization by methods known in the art for precursor transport to high aspect ratio structures may be required to achieve superb conformality in more aggressive structures, such as >40:1 AR.

There are several contexts related to CVD that should be clarified. First as mentioned above, ALD is often referred to as sequential reactions involving two reactive CVD precursors. Generally, ALD is a variant of CVD wherein the wafer substrate surface is sequentially exposed to reactive chemical precursors and each precursor pulse is separated from the subsequent precursor pulse by an inert purge gas period. The heart of the ALD technology is the self-limiting and self-passivating nature of each precursor's reactions on the heated wafer substrate surface. STAR-ALD and TE-ALD are such processes, except conditions are established so as to permit purge free operation.

Another aspect is the intentional encouragement of parasitic CVD, accompanying ALD. In the TE-ALD and STAR-ALD cases, this is permissible and advantageous in certain cases. Especially where the CVD admixture is surface reactive, the conformal characteristics are sustained. More than 1% admixture of parasitic CVD with the starved ALD mode may or may not be desirable depending on the application. In the case of purge-free operation, it may be found that some overlap of spacing of the turn-off edge and turn-on edge of two sequential precursors is desirable and a 10-20% tolerance is appropriate, for example, if the TMA and $H_2O$ pulses were 100 msec, an overlap or separation of 10-20 msec may be suitable for STAR-ALD in a purge-free mode.

Deposition by TE-ALD and STAR-ALD may be useful as film density, stress, parasitic impurity and the like may be engineered and point defect properties may be affected. Further the STAR-ALD process can improve film growth rates up to 20 times those achievable using conventional ALD process, while maintaining the merits of ALD characteristics. Therefore the STAR-ALD process may be applicable to a much broader area, from thin film heads to manufacturing semiconductors. It is also possible to further tailor film quality while providing much higher growth rates than conventional ALD process. For example, a sequential process of ALD and STAR-ALD may be used. At a very initial stage, conventional ALD may provide a good seed layer and the process can then be switched to STAR-ALD, or conversely, the other way around. If ALD is used initially, then STAR-ALD will be the major film deposition vehicle to achieve a higher growth rate. If the STAR-ALD is used first, the interface growth may be favorably modified. This concept can be further expanded by the use of various combinations: ALD/STAR-ALD/ALD, ALD/TE-ALD/STAR-ALD and the like sequences, which may be used to improve film qualities, especially for high-K oxide applications.

Thus, methods and apparatus for transient enhanced ALD have been described. Although discussed with reference to various embodiments, it should be remembered that these were used merely for illustration and the present invention should not be limited thereby. For example, many other films may be deposited using the high productivity processes described herein. They include dielectrics such as, but not limited to: $Al_2O_3$, $HfO_2$, $ZrO_2$, $La_2O_3$, $Ta_2O_5$, $TiO_2$, $Y_2O_3$, $Si_3N_4$, SiN, and $SiO_2$, combination tertiary and quarternary compound alloys thereof (examples of which may be HfAlON and HfSiON), as well as certain III-V compounds such as GaAs, GaN, GaALN alloys, and the like. They also include metals and meal nitrides, such as W, $WSi_x$, WN, Ti, TiN, Ta, and TaN. Combination metallic materials such as TiSiN and TiAlN are also possible. For each of the above, post-deposition anneals may be used to improve/modify the films. Accordingly, the scope of the invention should be measured only in terms of the claims, which follow.

What is claimed is:

1. An atomic layer deposition (ALD) process using starved reactions, said ALD process comprising:
    exposing a wafer to a starved dose of a first chemically reactive precursor, said starved dose being selected to yield less than one-half of a maximum saturated ALD growth rate, measured in film thickness per ALD process cycle, for said first chemically reactive precursor, wherein said first chemically reactive precursor is a soft saturating precursor characterized by an onset of a slow increase in ALD growth rate with further increases of precursor exposure dose and having a longer saturation time as compared to a second chemically reactive precursor to follow the first chemically reactive precursor, and the exposure to the starved dose of the first chemically reactive precursor determines a value of a starved saturation ALD growth rate, measured in film thickness per ALD process cycle, for a second chemically reactive precursor to follow the first chemically reactive precursor; and exposing the wafer to a dose of the second chemically reactive precursor, the dose of the second chemically reactive precursor selected for achieving starved saturation of the second chemically reactive precursor under variations in dose of the second chemically reactive precursor, said starved saturation characterized by an ALD growth rate, measured in film thickness per ALD process cycle, of the second chemically reactive precursor being less than half of a maximum saturated ALD growth rate, measured in film thickness per ALD process cycle, for the second precursor, wherein:

said starved dose of said first chemically reactive precursor and the dose of the second chemically reactive precursor are selected to obtain a maximum starved ALD process film deposition rate as measured in film thickness per unit time for the first and second chemically reactive precursors, and said first and second chemically reactive precursors are delivered sequentially in time.

2. The ALD process of claim 1, wherein the dose of the second chemically reactive precursor is delivered substantially uniformly over the wafer.

3. The ALD process of claim 1, further comprising repeatedly exposing the wafer to the first and second chemically reactive precursor doses to form a material film on the wafer.

4. The ALD process of claim 1, wherein a non-uniformity of a thickness of a resulting film is within +/− 1.5%, 1 sigma.

5. The ALD process of claim 1, wherein the first and second chemically reactive precursors are delivered substantially uniformly via a showerhead or distribution plate.

6. The ALD process of claim 1, wherein a purge follows exposure of the wafer to the starved dose of the first chemically reactive precursor, but no purge follows exposure of the wafer to the dose of the second chemically reactive precursor.

7. The ALD process of claim 1, wherein exposure of the wafer to the second chemically reactive precursor follows exposure of the wafer to the starved dose of the first chemically reactive precursor without a purge, and a purge is used following exposure of the wafer to the dose of the second chemically reactive precursor.

8. The ALD process of claim 1, wherein purges follow exposure of the wafer to both the starved dose of the first chemically reactive precursor, and the dose of the second chemically reactive precursor.

9. The ALD process of claim 1, wherein exposure of the wafer to the second chemically reactive precursor follows exposure of the wafer to the starved dose of the first chemically reactive precursor without a purge, and no purge is used following exposure of the wafer to the dose of the second chemically reactive precursor.

10. An atomic layer deposition (ALD) process using starved reactions said ALD process comprising:

exposing a wafer to a starved dose of a first chemically reactive precursor, said starved dose being selected to yield less than one-half of a maximum saturated ALD growth rate, measured in film thickness per ALD process cycle, for said first chemically reactive precursor, wherein said first chemically reactive precursor is a soft saturating precursor characterized by an onset of a slow increase in ALD growth rate with further increases of precursor exposure dose and having a longer saturation time as compared to a second chemically reactive precursor to follow the first chemically reactive precursor, and the exposure to the starved dose of the first chemically reactive precursor determines a value of a starved saturation ALD growth rate, measured in film thickness per ALD process cycle, for a second chemically reactive precursor to follow the first chemically reactive precursor: and exposing the wafer to a dose of the second chemically reactive precursor, the dose of the second chemically reactive precursor selected for achieving starved saturation of the second chemically reactive precursor under variations in dose of the second chemically reactive precursor, said starved saturation characterized by an ALD growth rate measured in film thickness per ALD process cycle, of the second chemically reactive precursor being less than half of a maximum saturated ALD growth rate, measured in film thickness per ALD process cycle, for the second precursor, wherein:

said starved dose of said first chemically reactive precursor and the dose of the second chemically reactive precursor are selected to obtain a maximum starved ALD process film deposition rate as measured in film thickness per unit time for the first and second chemically reactive precursors, and said first and second chemically reactive precursors are delivered sequentially in time, and one of the first and second chemically reactive precursor doses comprises water ($H_2O$) and the other comprises Trimethylaluminum (TMA).

11. The ALD process of claim 10, wherein one or both of the first and/or second chemically reactive precursor doses is applied for a time between approximately 0.02 sec to approximately 0.5 sec.

12. The ALD process of claim 10, wherein the dose of the second chemically reactive precursor is delivered substantially uniformly over the wafer.

13. The ALD process of claim 10, further comprising repeatedly exposing the wafer to the first and second chemically reactive precursor doses to form a material film on the wafer.

14. The ALD process of claim 10, wherein a non-uniformity of a thickness of a resulting film is within +/−1.5%, 1 sigma.

15. The ALD process of claim 10, wherein the first and second chemically reactive precursors are delivered substantially uniformly via a showerhead or distribution plate.

16. The ALD process of claim 10, wherein a purge follows exposure of the wafer to the starved dose of the first chemically reactive precursor, but no purge follows exposure of the wafer to the dose of the second chemically reactive precursor.

17. The ALD process of claim 10, wherein exposure of the wafer to the second chemically reactive precursor follows exposure of the wafer to the starved dose of the first chemically reactive precursor without a purge, and a purge is used following exposure of the wafer to the dose of the second chemically reactive precursor.

18. The ALD process of claim 10, wherein purges follow exposure of the wafer to both the starved dose of the first chemically reactive precursor, and the dose of the second chemically reactive precursor.

19. The ALD process of claim 10, wherein exposure of the wafer to the second chemically reactive precursor follows exposure of the wafer to the starved dose of the first chemically reactive precursor without a purge, and no purge is used following exposure of the wafer to the dose of the second chemically reactive precursor.

* * * * *